United States Patent
Lee et al.

(10) Patent No.: US 11,244,840 B2
(45) Date of Patent: Feb. 8, 2022

(54) DIE EJECTORS AND DIE SUPPLYING APPARATUSES INCLUDING THE SAME

(71) Applicant: Samsung Electronics Co., Ltd., Suwon-si (KR)

(72) Inventors: Bub-ryong Lee, Asan-si (KR); Jung-lae Jung, Asan-si (KR); Sung-hyeon Park, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 149 days.

(21) Appl. No.: 16/366,152

(22) Filed: Mar. 27, 2019

(65) Prior Publication Data

US 2020/0111687 A1   Apr. 9, 2020

(30) Foreign Application Priority Data

Oct. 4, 2018 (KR) .................. 10-2018-0118495

(51) Int. Cl.
*H01L 21/67* (2006.01)
*H01L 21/683* (2006.01)

(52) U.S. Cl.
CPC .... *H01L 21/67132* (2013.01); *H01L 21/6836* (2013.01); *H01L 2221/68327* (2013.01)

(58) Field of Classification Search
CPC ........... H01L 21/67132; H01L 21/6836; H01L 2224/48091; H01L 2924/00014; H01L 2221/68327–68336; Y10T 56/1132–1137; Y10T 156/1179; Y10T 156/1944; Y10T 156/1978–1989
See application file for complete search history.

(56) References Cited

U.S. PATENT DOCUMENTS

| 6,115,498 A | 9/2000 | Ro et al. |
| 8,250,742 B2 | 8/2012 | Kloeckner et al. |
| 9,929,036 B2 | 3/2018 | Kwong et al. |
| 2012/0181355 A1 | 7/2012 | Corry et al. |

(Continued)

FOREIGN PATENT DOCUMENTS

| JP | 2011-117349 A | 6/2011 |
| KR | 10-0239357 B1 | 1/2000 |
| KR | 10-1091132 B1 | 12/2011 |

(Continued)

*Primary Examiner* — Matthew J Daniels
*Assistant Examiner* — Andrew L Swanson
(74) *Attorney, Agent, or Firm* — Harness, Dickey & Pierce, P.L.C.

(57) ABSTRACT

A die ejector includes a supporter configured to support a film on which a die is attached in a vertical direction, an elevation device in a hole of the supporter and configured to move the film with the die attached thereon in the vertical direction and in relation to the supporter, a driver configured to move the elevation device in the vertical direction, an air conduit guide in an enclosure region at least partially defined by an inner surface of the elevation device and having an inner surface defining an air flow conduit, a pressure adjuster device configured to induce air flow through the air flow conduit based on inducing a pressure gradient between the air flow conduit and the pressure adjuster device, and a flow guide in the air flow conduit and configured to control a flow of air through at least a portion of the air flow conduit.

20 Claims, 12 Drawing Sheets

(56) References Cited

U.S. PATENT DOCUMENTS

2014/0027049 A1    1/2014  Joo et al.
2017/0053830 A1*  2/2017  Haimoto ............... H01L 21/304

FOREIGN PATENT DOCUMENTS

| KR | 10-1397750 B1 | | 5/2014 |
| KR | 10-1543133 B1 | | 8/2015 |
| KR | 10-1612034 B1 | | 4/2016 |
| KR | 20160068201 A | * | 6/2016 |

* cited by examiner

DIE EJECTORS AND DIE SUPPLYING APPARATUSES INCLUDING IHE SAME

CROSS-REFERENCE TO RELATED APPLICATION

This application claims the benefit of Korean Patent Application No. 10-2018-0118495, filed on Oct. 4, 2018, in the Korean Intellectual Property Office, the disclosure of which is incorporated herein in its entirety by reference.

BACKGROUND

The inventive concepts relate to die ejectors and die supplying apparatuses including the same, and more particularly, to die ejectors for separating individualized dies from a film after a sawing process and die supplying apparatuses including the die ejectors.

A film may be attached on a backside of each wafer, to prevent dies from deviating therefrom in a sawing process. Dies individualized by the sawing process may be separated from the film by a die ejector. Recently, as a thickness dies is progressively decreased, a possibility of a risk where the dies are damaged in a process of being separated from the film by the die ejector is increasing.

SUMMARY

The inventive concepts provide die ejectors, which prevent dies individualized by a sawing process from being bent in a process of separating the dies from a film and thus decreases the reduction in performance of the dies and a risk where the dies are damaged, and die supplying apparatuses including the same.

According to some example embodiments, a die ejector may include a supporter that includes an inner surface defining a hole in a center of the supporter. The supporter may be configured to support a film on which a die is attached in a vertical direction that is substantially perpendicular to an upper surface of the supporter. The die ejector may include an elevation device in the hole of the supporter. The elevation device may be configured to move the film with the die attached thereon in the vertical direction and in relation to the supporter. The die ejector may include a driver that may be configured to move the elevation device in the vertical direction. The die ejector may include an air conduit guide in an enclosure region at least partially defined by an inner surface of the elevation device. The air conduit guide may have an inner surface defining an air flow conduit. The die ejector may include a pressure adjuster device configured to induce air flow through the air flow conduit based on inducing a pressure gradient between the air flow conduit and the pressure adjuster device. The die ejector may include a flow guide in the air flow conduit. The flow guide may be configured to control a flow of air through at least a portion of the air flow conduit.

According to some example embodiments, a die ejector may include a supporter. The supporter may include an inner surface defining a hole in a center of the supporter. The supporter may be configured to support a film on which a die is attached in a vertical direction that is substantially perpendicular to an upper surface of the supporter. The die ejector may include an elevation device in the hole of the supporter. The elevation device may be configured to move the film with the die attached thereon in the vertical direction and in relation to the supporter. The die ejector may include a driver configured to move the elevation device in the vertical direction. The die ejector may include an air conduit guide in an enclosure region at least partially defined by an inner surface of the elevation device. The air conduit guide may have an inner surface defining an air flow conduit. The die ejector may include a pressure adjuster device configured to provide injection pressure or suction pressure to an inner portion of the air conduit guide. The die ejector may include a first flow guide extending through a central longitudinal axis of the air conduit guide in the air flow conduit. The die ejector may include a plurality of second flow guides in the air conduit guide. The plurality of second flow guides may each be offset from the central longitudinal axis of the air conduit guide in a direction substantially perpendicular to the vertical direction. The plurality of second flow guides may each be offset from the first flow guide in the vertical direction. The first flow guide and the plurality of second flow guides may be configured to control a flow of air in the air flow conduit.

According to some example embodiments, a die supplying apparatus may include a wafer holder configured to support a wafer in a vertical direction that is substantially perpendicular to an upper surface of the wafer holder while a die is being separated from the wafer. The die supplying apparatus may include a transport robot configured to place the wafer on the wafer holder. The die supplying apparatus may include a die ejector configured to separate the die of the wafer from a film. The die ejector may include a supporter that includes an inner surface defining a hole in a center of the supporter. The supporter may be configured to support a film on which a die is attached in a vertical direction that is substantially perpendicular to an upper surface of the supporter. The die ejector may include an elevation device in the hole of the supporter. The elevation device may be configured to move the film with the die attached thereon in the vertical direction and in relation to the supporter. The die ejector may include a driver that may be configured to move the elevation device in the vertical direction. The die ejector may include an air conduit guide in an enclosure region at least partially defined by an inner surface of the elevation device. The air conduit guide may have an inner surface defining an air flow conduit. The die ejector may include a pressure adjuster device configured to induce air flow through the air flow conduit based on inducing a pressure gradient between the air flow conduit and the pressure adjuster device. The die ejector may include a flow guide in the air flow conduit. The flow guide may be configured to control a flow of air through at least a portion of the air flow conduit. The die supplying apparatus may include a transport member configured to relatively move the wafer holder with respect to the die ejector. The die supplying apparatus may include a bonding head configured to pick up the separated die and attach the picked-up die on a substrate.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings.

Figure 1:
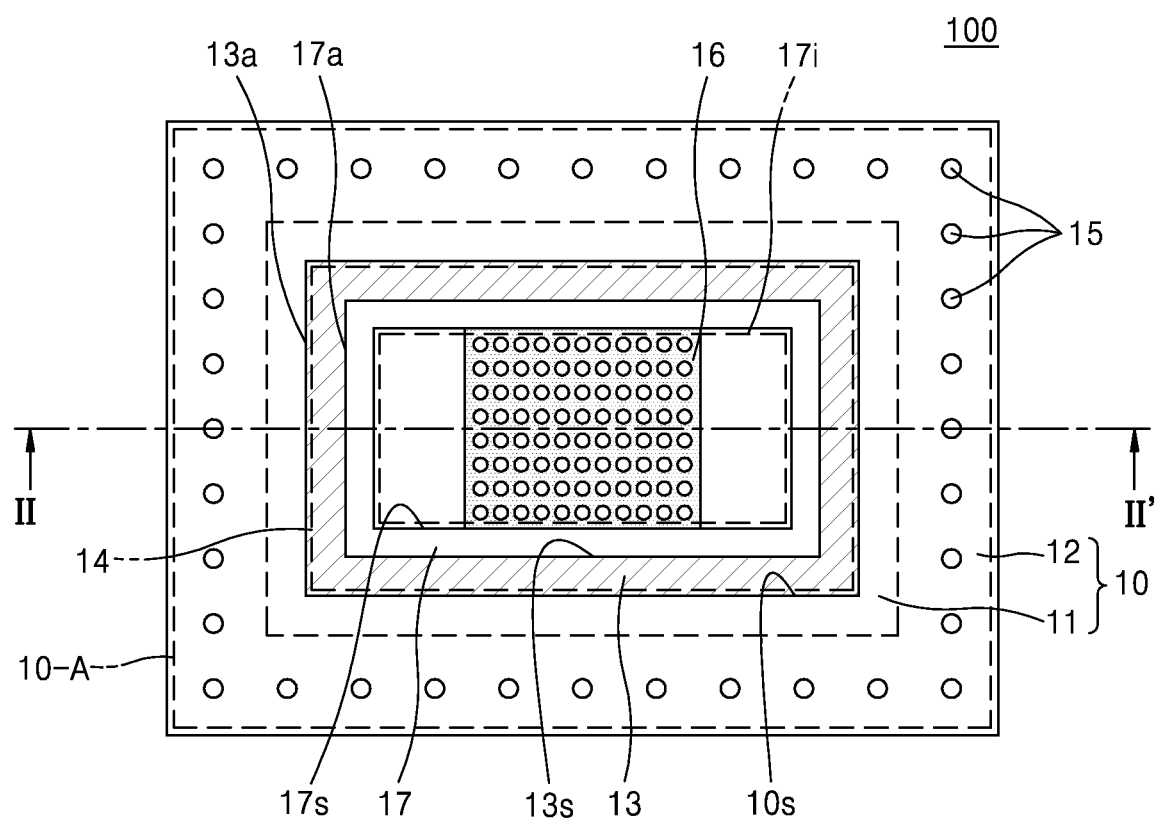
FIG. 1 is a plan view illustrating a die ejector according to some example embodiments.
Figure 2:
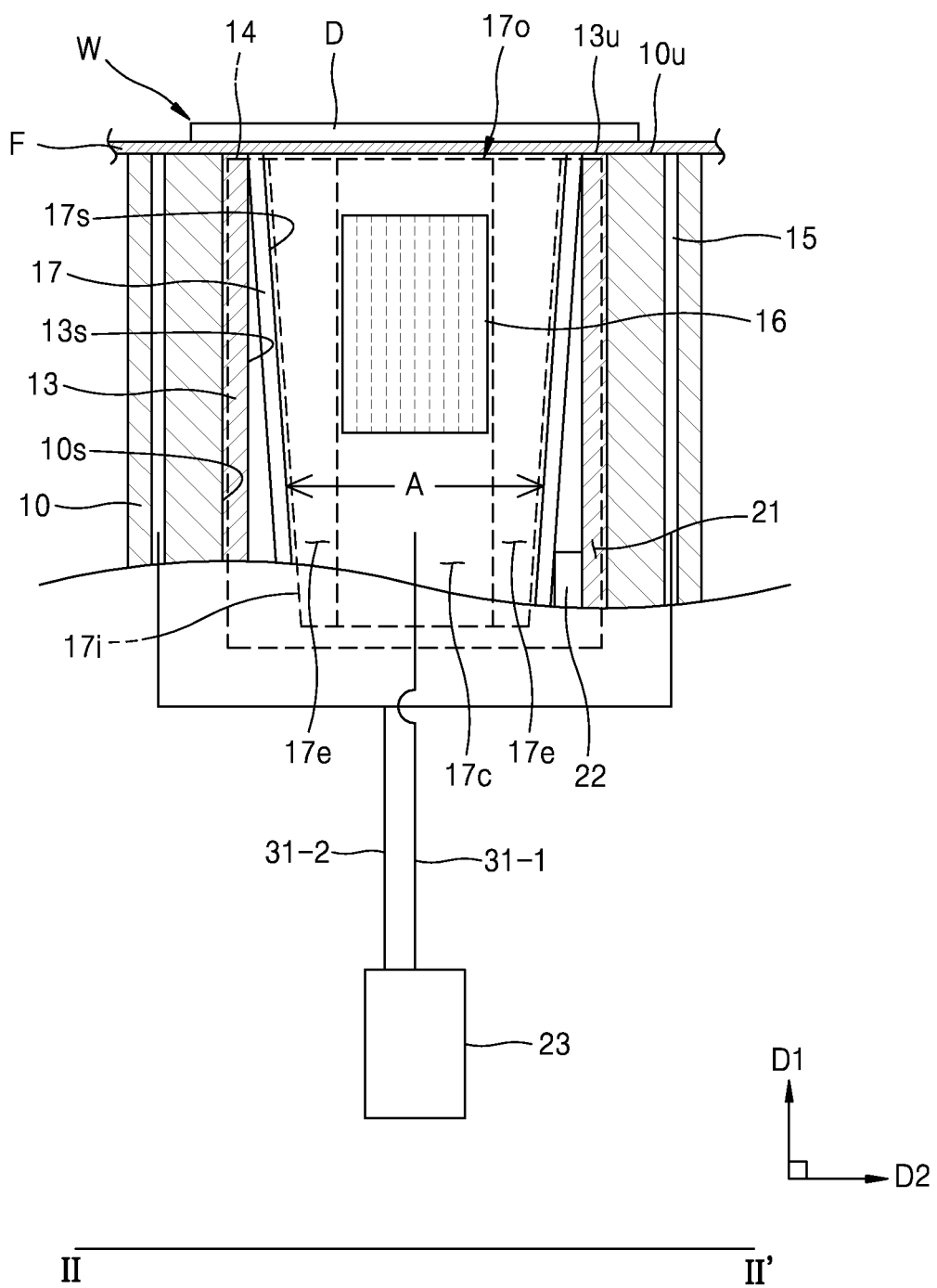
FIG. 2 is an internal cross-sectional view, along view line II-IF of FIG. 1, illustrating an internal portion of a die ejector according to some example embodiments.

FIG. 1 is a plan view illustrating a die ejector 100 according to some example embodiments. FIG. 2 is an internal cross-sectional view, along view line II-IF of FIG. 1, illustrating an internal portion of the die ejector 100 according to some example embodiments.

Referring to FIGS. 1 and 2, the die ejector 100 according to some example embodiments may include a supporter 10, an elevation device 13, an air conduit guide 17, a flow guide 16, and a pressure adjuster device 23.

The supporter 10 may have a ring shape where a hole 14 is provided in a center thereof. In more detail, as seen from above, the supporter 10 may have a shape such as a circular shape, an elliptical shape, or a polygonal shape, where the hole 14 is provided in the center of the supporter 10. Restated, and as shown in FIGS. 1-2, the supporter 10 may have an inner surface 10s that at least partially defines a hole 14 in a center of the supporter 10. As shown in at least FIG. 2, an upper surface area 10-A of the supporter 10 may be provided to be greater than the lower surface area D-A of a die D, which is to be separated from a wafer W.

The hole 14 of the supporter 10 may also be provided in a shape such as a circular shape, an elliptical shape, or a polygonal shape. In some example embodiments, the hole 14 may be provided in a shape corresponding to that of the die D, and for example, may be provided in a tetragonal shape. As shown in at least FIG. 2, a cross-sectional flow area of the hole 14 may be provided to be less than the lower surface area D-A of the die D which is to be separated from the wafer W.

When the die D which is to be separated from the wafer W is disposed in an upper center of the die ejector 100, for example as shown in FIG. 2, a center of the die D may overlap a center of the hole 14 in a vertical direction D1 and an edge of the die D may overlap the supporter 10 in the vertical direction D1. As shown in FIG. 2, the vertical direction D1 is perpendicular or substantially perpendicular (e.g., perpendicular within manufacturing tolerances and/or material tolerances) with the upper surfaces 10u and 13u of the supporter 10 and elevation device 13 and is further perpendicular or substantially perpendicular to the plane through which the film F extends on the upper surfaces 10u and 13u.

The supporter 10 may include a die positioning device 11 and a film fixing device 12. The die positioning device 11 may correspond to a region relatively adjacent to the hole 14 and may correspond to a region which is disposed inward from an upper surface 10u of the supporter 10. As shown in FIG. 1, the die positioning device 11 may be provided to have an area (inclusive of the cross-sectional area of the hole 14) which is substantially the same as a lower surface area D-A of the die D which is to be separated from the wafer W, and the die D which is to be separated from the wafer W may be safely positioned on the die positioning device 11.

As shown in FIG. 1, the film fixing device 12 may be provided in an outer side of the die positioning device 11. The film fixing device 12 may fix a film F to the film fixing device 12 while the die D is being separated from the film F.

A plurality of fixing holes 15 may be provided in an edge of the supporter 10. In more detail, and as shown in FIGS. 1-2, the plurality of fixing holes 15 may be provided (may extend) along a perimeter (e.g., edge) of the film fixing device 12 of the supporter 10, and thus may extend along a perimeter (e.g., edge) of the supporter 10. The plurality of fixing holes 15 may fix the film F to the film fixing device 12 of the supporter 10 while the die D is being separated from the film F. The plurality of fixing holes 15 may be coupled to the pressure adjuster device 23, and the pressure adjuster device 23 may apply vacuum pressure ("suction pressure") to the plurality of fixing holes 15, based on inducing a pressure gradient between the fixing holes 15 and the pressure adjuster device 23 to thereby reduce the pressure in the fixing holes 15 in relation to an ambient environment external to the die ejector 100, to cause the film F to be sucked onto the upper surface 10u of the supporter 10 and to be held in place on at least the upper surface 10u of the supporter 10. The film F may be solidly fixed to the film fixing device 12 by the pressure gradient between the ambient environment and the fixing holes, according to the vacuum pressure applied to each of the plurality of fixing holes 15 by the pressure adjuster device 23.

In view of the above, it will be understood that, as shown in FIGS. 1-2, the supporter 10 may be configured to structurally support the film F, on which the die D is attached, in the vertical direction D1.

The elevation device 13 may be disposed in an inner edge region of the hole 14 provided in the center of the supporter 10, such that the elevation device 13 extends around (e.g., covers) the inner surface 10s of the supporter 10. As seen from above in FIG. 1, the elevation device 13 may be provided in a circular ring shape, an elliptical ring shape, or a polygonal ring shape. As shown in FIG. 1, an outer surface 13a of the elevation device 13 may be provided to correspond to a shape of the hole 14. The outer surface 13a may be adjacent to the inner surface 10s Therefore, an area of the elevation device 13 (e.g., a cross-sectional area in a plane that is perpendicular to the vertical direction D1) may be provided to be less than the lower surface area D-A of the die D which is to be separated from the wafer W. The outer surface 13a of the elevation device 13 may be provided adjacent to an inner surface 10s of the supporter 10. In more detail, the outer surface 13a of the elevation device 13 may be provided to be less in size than the hole 14, and thus, the outer surface 13a of the elevation device 13 may be disposed apart from ("isolated from direct contact with") the inner surface 10s of the supporter 10 by a certain distance. The elevation device 13 may include an elevation shaft 21 which is configured to extend downward (e.g., in the vertical direction D1) from a ring-shaped upper portion thereof, as shown in at least FIG. 2. The elevation shaft 21 may be coupled to a driver 22. The driver 22 may upward and downward move the elevation device 13 through the elevation shaft 21. In some example embodiments, the driver 22 may be an actuator device and may include or may be coupled to a drive motor, such that the driver 22 is configured to actuate a coupled element between two or more positions. The driver 22 may reciprocate the elevation device 13 in the vertical direction D1 between a preparation position and a separation position through the elevation shaft 21. In more detail, and as shown in FIG. 2, when a current position of the elevation device 13 is the preparation position, an upper surface 13u of the elevation device 13 may be disposed on a same plane as the upper surface 10u of the supporter 10 and may be disposed lower in position, in the vertical direction D1, than the upper surface 10u of the supporter 10. When a current position is the separation position, the upper surface 13u of the elevation device 13 may be disposed higher in position, in the vertical direction D1 than the upper surface 10u of the supporter 10. As shown in FIG. 2, the driver 22 may be coupled to a lower portion of the elevation shaft 21 and may move the elevation device 13 in the vertical direction D1 to an upper portion with respect to the supporter 10 or may return the elevation device 13 to an original position. Accordingly, the elevation device 13 may be configured to move the film F with the die D attached thereon in the vertical direction D1 and in relation to the supporter 10, and the driver 22 may be configured to move the elevation device 13 in the vertical direction D1. In some example embodiments, the driver 22 may include a linear motor or a piston. The driver 22 may include a linear actuator which converts a rotational force of a motor into a linear motion of the elevation shaft 21, and for example, a conversion apparatus corresponding to the linear actuator may be a rack and pinion.

The air conduit guide 17 may be disposed in the hole 14 provided in the center of the elevation device 13. In more detail, as seen from above in FIG. 1, the air conduit guide 17 may be disposed in an inner edge region of an enclosure region at least partially define by the inner surface 13s of the elevation device 13 having a ring shape. As shown in FIGS. 1-2, an inner surface 17s of the air conduit guide 17 may define an air flow conduit 17i. The air conduit guide 17 may be provided in a circular ring shape, an elliptical ring shape, or a polygonal ring shape. An outer surface 17a of the air conduit guide 17 may be provided to correspond to a shape of an inner surface 13s of the elevation device 13 and may be provided adjacent to the inner surface 13s of the elevation device 13. In more detail, the outer surface 17a of the air conduit guide 17 may be provided to be less in size than the hole 14, and the outer surface 17a of the air conduit guide 17 may be disposed apart from (isolated from direct contact with) the inner surface 13s of the elevation device 13 by a certain distance.

The air conduit guide 17 may define an air flow conduit 17i that may provide a flow path of air which is injected or sucked into the air conduit guide 17 by the pressure adjuster device 23. The film F, on which the die D to be separated from the wafer W is attached, may be disposed in an upper portion of the hole 14 (i.e., an outlet 17o of the air conduit guide 17) disposed in the air conduit guide 17. In order to separate the die D from the film F, internal air pressure and/or air flow in the air flow conduit 17i of the air conduit guide 17 may be controlled by the pressure adjuster device 23 and may be injected to the outlet 17o of the air conduit guide 17, and moreover, the internal air pressure and/or air flow of the air flow conduit 17i of the air conduit guide 17 may be sucked ("drawn") towards the pressure adjuster device 23 according to control by the pressure adjuster device 23, for example based on the pressure adjuster device inducing air flow through the air flow conduit 17i based on inducing a pressure gradient between the air flow conduit 17i and the pressure adjuster device 23.

Moreover, as shown in at least FIG. 2, the air conduit guide 17 may have a structure where a width thereof increases in a direction toward the outlet 17o of the air conduit guide 17 (i.e., the upper portion of the hole 14). Restated, the inner surface 17s of the air conduit guide 17 may define the air flow conduit 17i to have a cross-sectional flow area A (perpendicular or substantially perpendicular to the vertical direction D1) that is inversely proportional to distance of the cross-sectional flow area in the vertical direction D1 from the outlet 17o of the air conduit guide 17. In more detail, the air conduit guide 17 may have a tapered structure where the width thereof is progressively widened in a direction toward the outlet 17o of the air conduit guide 17, and thus, an internal cross-sectional surface of the air conduit guide 17 may have a trapezoid shape where a width thereof increases in a direction toward an upper portion thereof as in FIG. 2.

As shown in at least FIG. 1, the flow guide 16 may be fixed to a portion of one or more inner surfaces 17s of the air conduit guide 17, such that the flow guide 16 is in the air flow conduit 17i. The flow guide 16 may control a flow of air flowing through the air flow conduit 17i, for example through the air flow conduit 17i between the outlet 17o and the pressure adjuster device 23.

In a die ejector which does not include the flow guide 16, an air pressure deviation may be large in the outlet of the air conduit guide 17. In more detail, in a case where the flow guide 16 is not provided in the air conduit guide 17, when air is injected or sucked through the air flow conduit 17i defined by the air conduit guide 17, pressure may be relatively high in a center region 17c near a center of the outlet 17o of the air conduit guide 17 and may be relatively low in an edge region 17e near an edge of the outlet 17o of the air conduit guide 17. This is because an air injection part for injecting air into the air conduit guide 17 is disposed in a portion near a lower center of the air conduit guide 17, as shown in at least FIG. 2 for example. Due to pressure of air concentrating on the center of the die D, adjacent to the center region 17c in the outlet 17o of the air conduit guide 17, bending of the die D may occur in a process of separating the die D from the film F. Due to the bending of the die D, a crack may occur in the edge of the die D, causing a reduction in performance of the die D.

The flow guide 16 of the die ejector 100 according to some example embodiments may be disposed in the air flow conduit 17i of the air conduit guide 17 and may control a flow of air through at least a portion of the air flow conduit 17i of the air conduit guide 17. In more detail, the flow guide 16 may adjust an internal cross-sectional area A of the air flow conduit 17i of the air conduit guide 17 and may block flow of air in a portion of the air flow conduit 17i of the air conduit guide 17, thereby allowing the air to bypass the flow guide 16 and flow in the air flow conduit 17i of the air conduit guide 17. In some example embodiments, the flow guide 16 may provide a new path through which air flows in the air flow conduit 17i of the air conduit guide 17. The new path provided by the flow guide 16 may be a through hole provided in the flow guide 16.

The flow guide 16 may include a material which is large in rigidity (e.g., has relatively high rigidity) and is small in deformation caused by heat (e.g., is resistant to heat-induced deformation). In some example embodiments, the flow guide 16 may have a porous structure including a plurality of cavities.

An air pressure deviation (e.g., pressure difference between the center region 17c and edge regions 17e) in the outlet 17o of the air conduit guide 17 may be reduced and/or minimized by the flow guide 16. Accordingly, the bending of the die D may be reduced in a process of separating the die D from the film F, thereby preventing the performance of the die D from being reduced.

A shape and an effect of the flow guide 16 will be described in more detail with reference to FIGS. 4 to 6.

Figure 3:
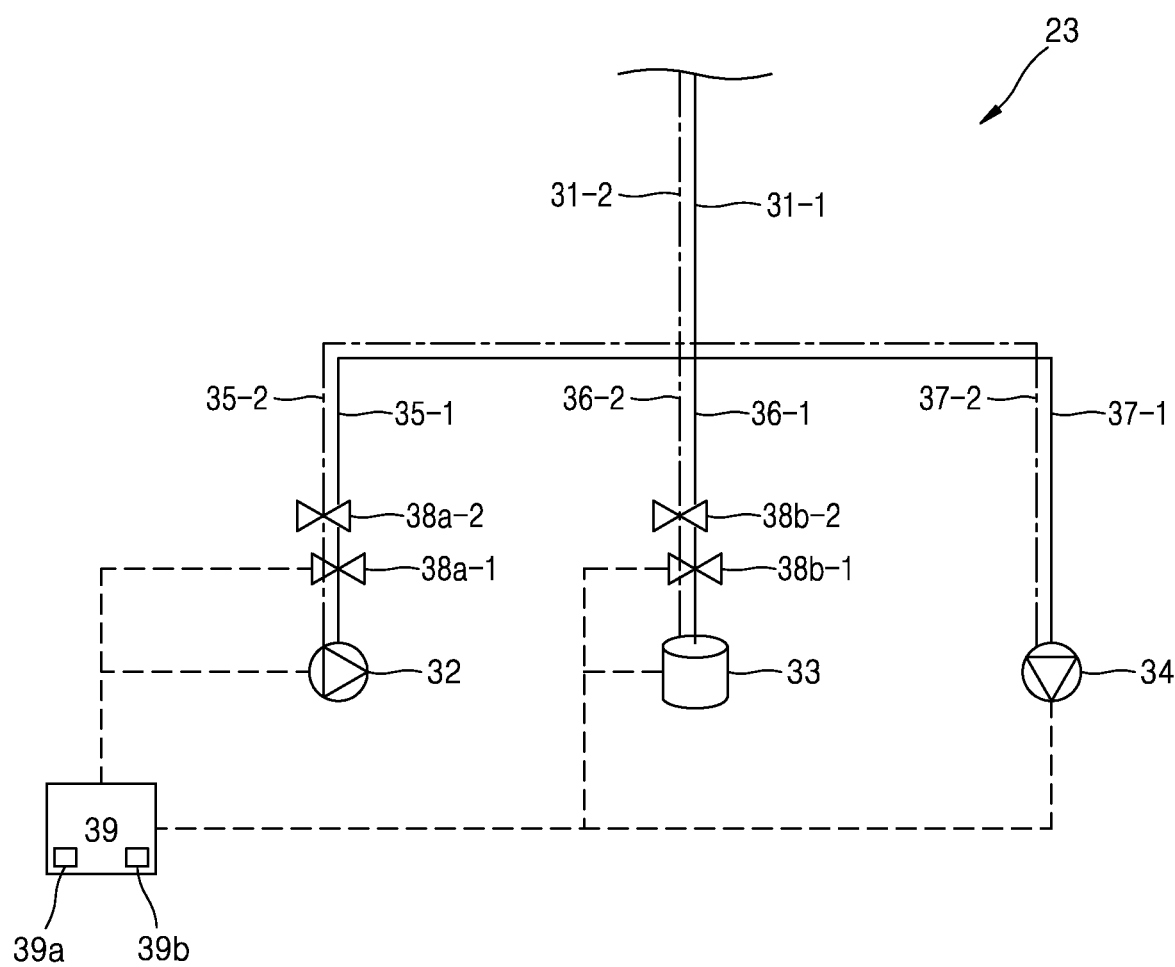
FIG. 3 is a diagram illustrating a pressure adjuster device and a controller of a die ejector according to some example embodiments.

FIG. 3 is a diagram illustrating a pressure adjuster device 23 and a controller 39 of a die ejector 100 according to some example embodiments.

Referring to FIG. 3 in conjunction with FIGS. 1 and 2, the pressure adjuster device 23 may be coupled to the hole 14 and the fixing holes 15 of the die ejector 100. In more detail, a main line 31-1 of the pressure adjuster device 23 may be coupled to the hole 14, via the air flow conduit 17i, and a main line 31-2 of the pressure adjuster device 23 may be coupled to the fixing holes 15. As shown, main lines 31-1 and 31-2 may be coupled to the air flow conduit 17i and fixing holes 15, respectively, independently of each other, such that, for example, a suction pressure may be applied to the fixing holes 15 via main line 31-2 while an injection pressure is applied to the air flow conduit 17i via main line 31-1. A depressurization device 32 may be coupled to depressurization lines 35-1 and 35-2 branching from the main lines 31-1 and 31-2, respectively, and a pressurization device 33 may be coupled to pressurization lines 36-1 and 36-2 branching from the main lines 31-1 and 31-2, respectively. Depressurization valves 38a-1 and 38a-2 may be provided on the respective depressurization lines 35-1 and 35-2, and pressurization valves 38b-1 and 38b-2 may be provided on the respective pressurization lines 36-1 and 36-2. An exhaust device 34 may be coupled to exhaust lines 37-1 and 37-2 branching from the main lines 31-1 and 31-2, respectively. The controller 39 may control the depressurization valves 38a-1 and 38-2 and the pressurization valves 38b-1 and 38b-2 independently of each other.

The controller 39, which may include and/or may be implemented by a memory device 39a (e.g., storage device) storing a program of instructions and a processor 39b (e.g., processing circuitry) that may execute the program of instructions stored on the memory device 39a, may control the depressurization device 32, the pressurization device 33, the exhaust device 34, the depressurization valves 38a-1 and 38a-2, and the pressurization valves 38b-1 and 38b-2, in order to collectively and/or independently control the flow of air and/or pressure applied to the separate, respective main lines 31-1 and 31-2.

In more detail, when it is required to depressurize an internal portion of the hole 14 (e.g., the air flow conduit 17i) provided in the air conduit guide 17, the controller 39 may control the depressurization valve 38a-1 in order for the main line 31-1 to be coupled to the depressurization line 35-1. The main line 31-1 may be coupled to the depressurization line 35-1, and then, the controller 39 may operate the depressurization device 32. When the depressurization device 32 operates, an internal gas of the hole 14 (e.g., air flow conduit 17i) may be exhausted by the depressurization device 32, and thus, suction pressure may be generated in the hole 14 (e.g., air flow conduit 17i). At this time, the controller 39 may control the depressurization line 35-1 to be coupled to the exhaust line 37-1, thereby allowing air remaining in the depressurization line 35-1 or the exhaust line 37-1 to be discharged to the outside (e.g., ambient environment).

In another example, when it is required to depressurize an internal portion of the fixing holes 15, the controller 39 may control the depressurization valve 38a-2 in order for the main line 31-2 to be coupled to the depressurization line 35-2. The main line 31-2 may be coupled to the depressurization line 35-2, and then, the controller 39 may operate the depressurization device 32. When the depressurization device 32 operates, an internal gas of the fixing holes 15 may be exhausted by the depressurization device 32, and thus, suction pressure may be generated in the fixing holes 15. At this time, the controller 39 may control the depressurization line 35-2 to be coupled to the exhaust line 37-2, thereby allowing air remaining in the depressurization line 35-2 or the exhaust line 37-2 to be discharged to the outside (e.g., ambient environment).

When it is required to depressurize the internal portion of the hole 14 provided in the air conduit guide 17, the controller 39 may control the pressurization valve 38b-1 in order for the main line 31-1 to be coupled to the pressurization line 36-1. The main line 31-1 may be coupled to the pressurization line 36-1, and then, the controller 39 may operate the pressurization device 33. When the pressurization device 33 operates, a gas may be applied to the internal portion of the hole 14 and thus, injection pressure may be generated in the hole 14 (e.g., in the air flow conduit 17i).

When it is required to depressurize the internal portion of the fixing holes 15, the controller 39 may control the pressurization valve 38b-2 in order for the main line 31-2 to be coupled to the pressurization line 36-2. The main line 31-2 may be coupled to the pressurization line 36-2, and then, the controller 39 may operate the pressurization device 33. When the pressurization device 33 operates, a gas may be applied to the fixing holes 15 and thus, injection pressure may be generated in the fixing holes 15.

The controller 39 may control the depressurization device 32 and the pressurization device 33 so that a level of pressure needed for the hole 14 (e.g., in the air flow conduit 17i) varies depending on the case. Levels of suction pressure and injection pressure capable of causing damage of a die D may differ based on a thickness of the die D which is to be separated from a wafer W disposed in an upper portion of the outlet 17o of the hole 14 (e.g., in the air flow conduit 17i) of the air conduit guide 17. Therefore, the controller 39 may control the depressurization device 32 and the pressurization device 33 so that the suction pressure and the injection pressure, which differ, are generated in the hole 14 (e.g., in the air flow conduit 17i), based on a thickness of the die D.

Figure 4:
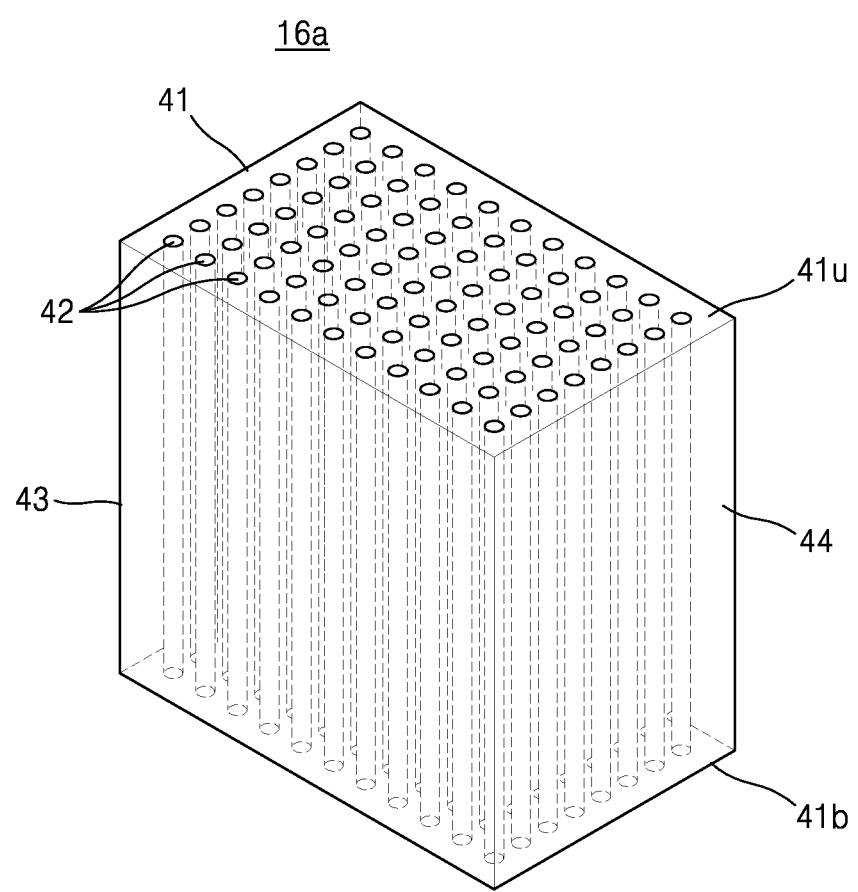
FIG. 4 is a diagram illustrating a flow guide of a die ejector according to some example embodiments.

FIG. 4 is a diagram illustrating a flow guide 16a of a die ejector according to some example embodiments. The flow guide 16a shown in FIG. 4 may be the flow guide 16 shown in FIGS. 1-2.

Referring to FIG. 4, the flow guide 16a may include a body 41 and a plurality of through holes 42 passing therethrough between an upper surface 41u and a lower surface 41b of the body 41.

As shown in FIGS. 1-2, the flow guide 16a may be disposed in the center region 17c of the air flow conduit 17i of the air conduit guide 17 of the die ejector 100. In more detail, a center of the flow guide 16a may be disposed in the center region 17c of the air flow conduit 17i of the air conduit guide 17 to overlap the center of the hole 14.

As shown in FIG. 4, the flow guide 16a may have a rectangular parallelepiped shape. The plurality of through holes 42 may each have a polygonal pillar shape extending through the body 41 between the upper surface 41u and the lower surface 41b of the flow guide 16a having a rectangular parallelepiped shape. In some example embodiments, the plurality of through holes 42 of the flow guide 16a may each have a circular pillar shape.

A first surface 43 and a surface, which is opposite to the first surface 43, of the flow guide 16a having a rectangular parallelepiped shape may contact an inner surface of the air conduit guide 17 as in FIG. 1. A second surface 44 vertical to the first surface 43 and a surface opposite to the second surface 44 in the flow guide 16a may not contact the inner surface of the air conduit guide 17, and thus, a path through which air flows may be provided between the flow guide 16a and the air conduit guide 17.

A diameter of each of the through holes 42 having a circular pillar shape may be about 300 µm to about 500 µm. In more detail, the diameter of each of the through holes 42 having a circular pillar shape may be about 400 µm. Each of the through holes 42 may be provided apart from another adjacent through hole 42 by about 100 µm to about 1,000 µm. The volume in which the plurality of through holes 42 are provided may be about 30% to about 70% of the volume in which an external appearance of the flow guide 16a having a rectangular parallelepiped shape is provided.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

The flow guide 16a may include ("may at least partially comprise") a ceramic material. Since the flow guide 16a includes a ceramic material, a process of forming the through holes 42 in the flow guide 16a may be easily performed. In some example embodiments, the flow guide 16a including the ceramic material may be reinforced by using a metal fiber, for increasing rigidity.

The flow guide 16a may be disposed in the internal center of the air conduit guide 17 of the die ejector 100, and thus, may provide a path which enables air to flow in the plurality of through holes 42 provided in the flow guide 16a and may provide another path which enables air to flow in a space provided between the flow guide 16a and the air conduit guide 17.

Some air in the air conduit guide 17 may flow through an inner path of each of the through holes 42 of the flow guide 16a, and air which does not flow through the inner path of each of the through holes 42 may bypass the flow guide 16a to flow through a path provided between the flow guide 16a and the air conduit guide 17.

Since the die ejector 100 according to some example embodiments includes the flow guide 16a, an air pressure deviation in the outlet of the air conduit guide 17 may be reduced and/or minimized. Accordingly, bending of the die D may be reduced in a process of separating the die D from the film F, thereby solving a problem where a crack occurs in the die D and the performance of the die D is reduced.

Figure 5:
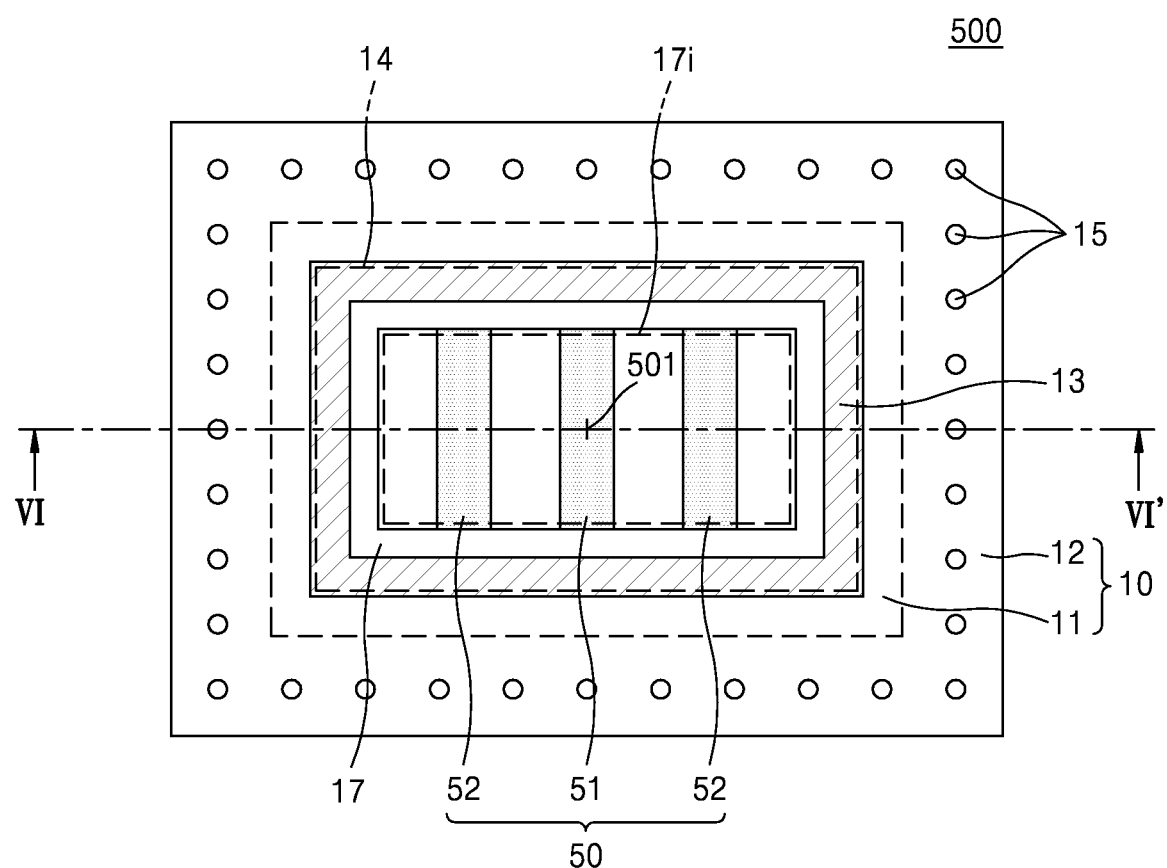
FIG. 5 is a plan view illustrating a die ejector including a flow guide according to some example embodiments.

FIG. 5 is a plan view illustrating a die ejector 500 including a flow guide 50 according to some example embodiments. FIG. 6 is an internal cross-sectional view, along view line VI-VI' of FIG. 5, illustrating an internal portion of the die ejector 500 including the flow guide 50 according to some example embodiments.

Figure 6:
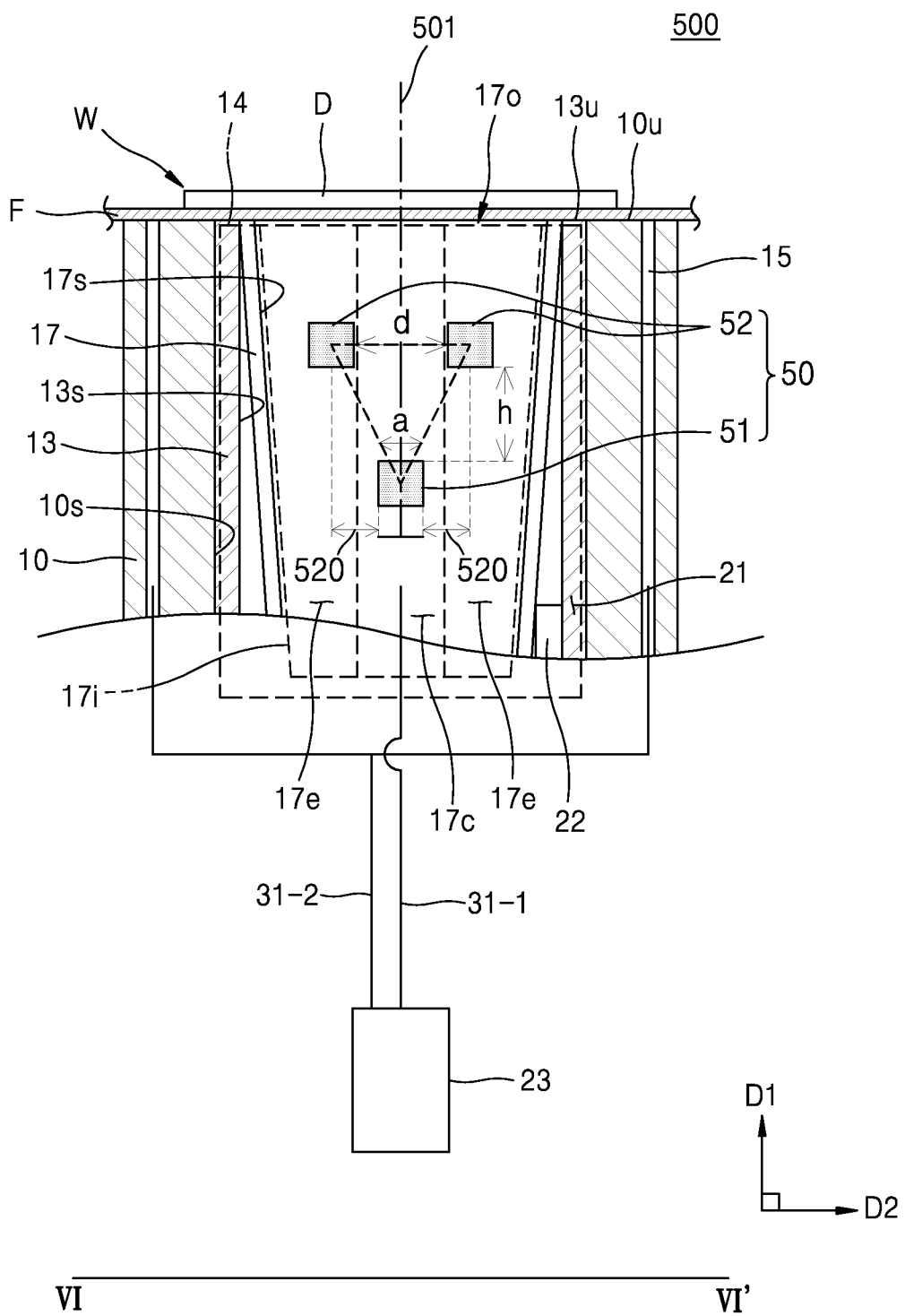
FIG. 6 is an internal cross-sectional view, along view line VI-VI' of FIG. 5, illustrating an internal portion of a die ejector including a flow guide according to some example embodiments.

Referring to FIGS. 5 and 6, the die ejector 500 may include a supporter 10, an elevation device 13, an air conduit guide 17, a flow guide 50, and a pressure adjuster device 23. The technical spirits of the supporter 10, the elevation device 13, the air conduit guide 17, the flow guide 16, and the pressure adjuster device 23 are substantially the same as descriptions given above with reference to FIGS. 1 and 2, and thus, their detailed descriptions are omitted.

The flow guide 50 of the die ejector 500 according to some example embodiments may include a first flow guide 51 and a second flow guide 52.

The first flow guide 51 may be disposed in a center region 17c of the air flow conduit 17i of the air conduit guide 17. In more detail, the first flow guide 51 may be disposed in the center region 17c of the air flow conduit 17i of the air conduit guide 17 in order for a center of the first flow guide 51 to overlap (extend through) a central longitudinal axis 501 of the air conduit guide 17 in the air flow conduit 17i. The first flow guide 51 may have a rod shape which crosses (e.g., extends transversely in a direction perpendicular or substantially perpendicular to the vertical direction D1) the air flow conduit 17i of the air conduit guide 17. In some example embodiments, the first flow guide 51 may be a rod having a rectangular parallelepiped shape.

The second flow guide 52 may be provided to have a height difference with the first flow guide 51 in the air conduit guide 17 (e.g., may be offset by distance "h" in the vertical direction D1 from the first flow guide 51). In other words, the second flow guide 52 may be disposed in a height level which differs from that of the first flow guide 51. That is, a vertical distance from the film F to the first flow guide 51 may differ from a vertical distance from the film F to the second flow guide 52. Referring to FIG. 6, the second flow guide 52 may be closer to the film F than the first flow guide 51.

Moreover, the second flow guide 52 may be spaced apart from the central longitudinal axis 501 of the air conduit guide 17 (e.g., offset from the central longitudinal axis 501 in a direction D2 that is perpendicular or substantially perpendicular to the vertical direction D1, where substantially perpendicular means perpendicular within manufacturing tolerances and/or material tolerances) by a certain distance 520 and may be provided in plurality. The plurality of second flow guides 52 may be provided in a symmetrical shape with respect to the central longitudinal axis 501 of the air conduit guide 17, such that the second flow guides 52 are symmetrically positioned in relation to the central longitudinal axis 501 of the air conduit guide 17. Each of the plurality of second flow guides 52 may have a rod shape which crosses the air flow conduit 17i of the air conduit guide 17. In some example embodiments, each of the plurality of second flow guides 52 may be a rod having a rectangular parallelepiped shape.

As shown in at least FIG. 5, some of side surfaces of the first and second flow guides 51 and 52 may contact an inner surface 17s of the air conduit guide 17. In some example embodiments, as further shown in at least FIG. 5, the other side surfaces of the first and second flow guides 51 and 52 may not contact the inner surface 17s of the air conduit guide 17, thereby providing a path enabling air to flow in a space between the first flow guide 51 and the air conduit guide 17 and a space between the second flow guide 52 and the air conduit guide 17 inner surface 17s within the air flow conduit 17i.

Referring to FIG. 6, the first flow guide 51 may be provided as one (e.g., may be an individual structure), and the second flow guide 52 may be provided as two (e.g., may include two separate structures). Therefore, the first flow guide 51 and the second flow guides 52 may be disposed in a triangular shape in the air conduit guide 17.

In some example embodiments, the two second flow guides 52 may be disposed on the first flow guide 51, and thus, the first flow guide 51 and the two second flow guides 52 may be disposed in an inverted triangle. In more detail, the inverted triangle may be an acute triangle and may be an isosceles triangle which is symmetrical about a central axis of the hole 14. However, some example embodiments are not limited thereto, and the two second flow guides 52 may be disposed under the first flow guide 51.

The first flow guide 51 and the second flow guides 52 may include the same material and may have the same shape and volume, and a separation distance d between the two second flow guides 52 in the direction D2 may be greater than a width a of the first flow guide 51 in the direction D2. In some example embodiments, the separation distance d between the two second flow guides 52 may be about 1.5 to 3 times the width a of the first flow guide 51 in direction D2. In some example embodiments, a vertical distance h between the first flow guide 51 and each of the second flow guides 52 in direction D1 may be about 0.5 to 3 times the separation distance d between the two second flow guides 52 in direction D2.

The first flow guide 51 and the second flow guides 52 may each include a material which is large in rigidity and is small in deformation caused by heat. In some example embodiments, each flow guide of the first flow guide 51 and the second flow guides 52 may include (e.g., may at least partially comprise) alloy tool steel which is easily processed, is large in rigidity, and is small in deformation caused by heat.

When injection pressure is generated in the air conduit guide 17, pressure of air injected from a lower portion of the air conduit guide 17 may be relatively high in a center region 17c of the air flow conduit 17i of the air conduit guide 17 and may be relatively low in an edge region of the air flow conduit 17i of the air conduit guide 17.

Referring to FIG. 6, the first flow guide 51 may block flow of air in the center region 17c of the air conduit guide 17, thereby allowing the air injected from the lower portion of the air conduit guide 17 to bypass the first flow guide 51 and move to an upper portion without passing through the center region 17c of the air conduit guide 17. Accordingly, pressure of air passing through the first flow guide 51 may be relatively low in the center region 17c of the air conduit guide 17 and may be relatively high in the edge region 17e of the air conduit guide 17.

The plurality of second flow guides 52 may be disposed in a portion spaced apart from the central longitudinal axis 501 in direction D2 by a certain distance. Air passing through the first flow guide 51 may bypass the second flow guides 52 and may flow to the outlet 17o of the air conduit guide 17. In more detail, the air passing through the first flow guide 51 may bypass the second flow guides 52 and may flow to the center region 17c or the edge region 17e. In this case, the second flow guides 52 may be disposed so that air bypassing the second flow guides 52 flows more to the center region 17c than the edge region 17e. Accordingly, pressure (i.e., an air pressure deviation in the outlet 17o of the air conduit guide 17) of air passing through the second flow guides 52 may be reduced and/or minimized. Accordingly, the first and second flow guides 51 and 52 may control a flow of air in the air flow conduit 17i. The first flow guide 51 may be configured to control the flow of air in a center region 17c of the air flow conduit 17i, and two second flow guides 52 may be configured to control the flow of air passing through the first flow guide 51 at positions spaced apart from the central longitudinal axis 501 of the air conduit guide 17 in the direction D2 that is substantially perpendicular to the vertical direction D1.

When suction pressure is generated in the air conduit guide 17, the air pressure deviation in the outlet of the air conduit guide 17 may be reduced and/or minimized based on the above-described principle.

Therefore, since the die ejector 500 according to some example embodiments includes the flow guide 50, bending of the die D may be prevented in a process of separating the die D from the film F, thereby preventing the reduction in performance of the die D.

The number and disposition of first and second flow guides 51 and 52 are not limited to the above description. A various number of first and second flow guides 51 and 52 may be disposed at various positions so as to minimize the air pressure deviation in the outlet of the air conduit guide 17.

Figure 7:
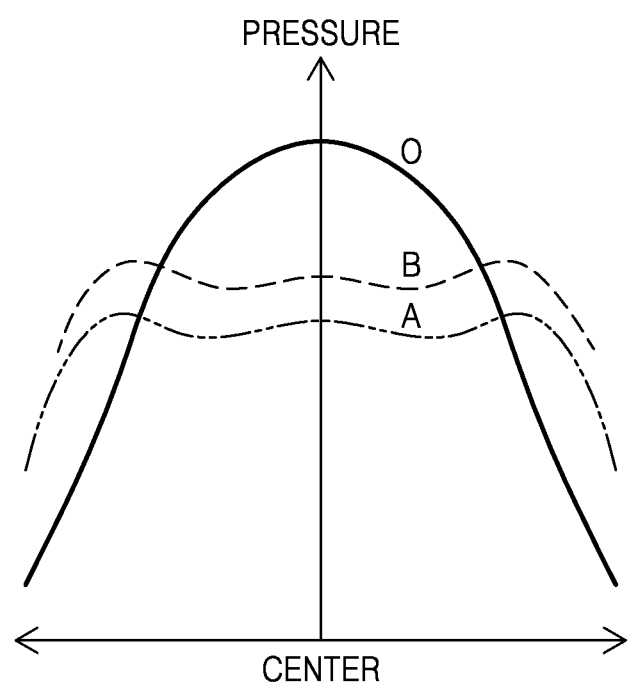
FIG. 7 is a graph showing air pressure in an outlet of an air conduit guide of a die ejector including a flow guide according to some example embodiments.

FIG. 7 is a graph showing air pressure in the outlet of the air conduit guide 17 of each of the die ejectors 100 and 500 respectively including the flow guides 16a and 50 according to some example embodiments.

Referring to FIG. 7, the abscissa axis of the graph represents a distance to the central axis of the hole 14 of the air conduit guide 17, and the ordinate axis of the graph represents pressure of air in the outlet of the air conduit guide 17.

A solid line O in the graph represents pressure information about air in an outlet of an air conduit guide of a die ejector which does not include the flow guide 16a or 50 according to some example embodiments. A first dashed line A in the graph represents pressure information about air in the outlet of the air conduit guide 17 of the die ejector 100 including the flow guide 16a described above with reference to FIG. 4, and a second dashed line B in the graph represents pressure information about air in the outlet of the air conduit guide 17 of the die ejector 500 including the flow guide 50 described above with reference to FIGS. 5 and 6.

Referring to the solid line O, in the die ejector including no flow guide according to some example embodiments, pressure of air in the outlet of the air conduit guide 17 is relatively high in a portion near the center of the hole 14 and is relatively low in a portion near the edge of the hole 14. In other words, a pressure deviation in the outlet of the air conduit guide 17 is large. Due to this, in a process of separating the die D from the film F, bending of the die D may occur due to pressure of air concentrating on the center of the die D. Due to the bending of the die D, a crack may occur in an edge of the die D, causing a reduction in performance of the die D.

Referring to the first dashed line A and the second dashed line B, in the die ejectors 100 and 500 respectively including the flow guides 16a and 50 according to some example embodiments, pressure of air in the outlet of the air conduit guide 17 may be substantially uniform from a portion near the center of the hole 14 to a portion near the edge of the hole 14. In other words, since the die ejectors 100 and 500 according to some example embodiments respectively include the flow guides 16a and 50, the air pressure deviation in the outlet of the air conduit guide 17 may be reduced and/or minimized. Accordingly, the die ejectors 100 and 500 according to some example embodiments may reduce bending of the die D in the process of separating the die D from the film F, thereby preventing the reduction in performance of the die D.

Figure 8:
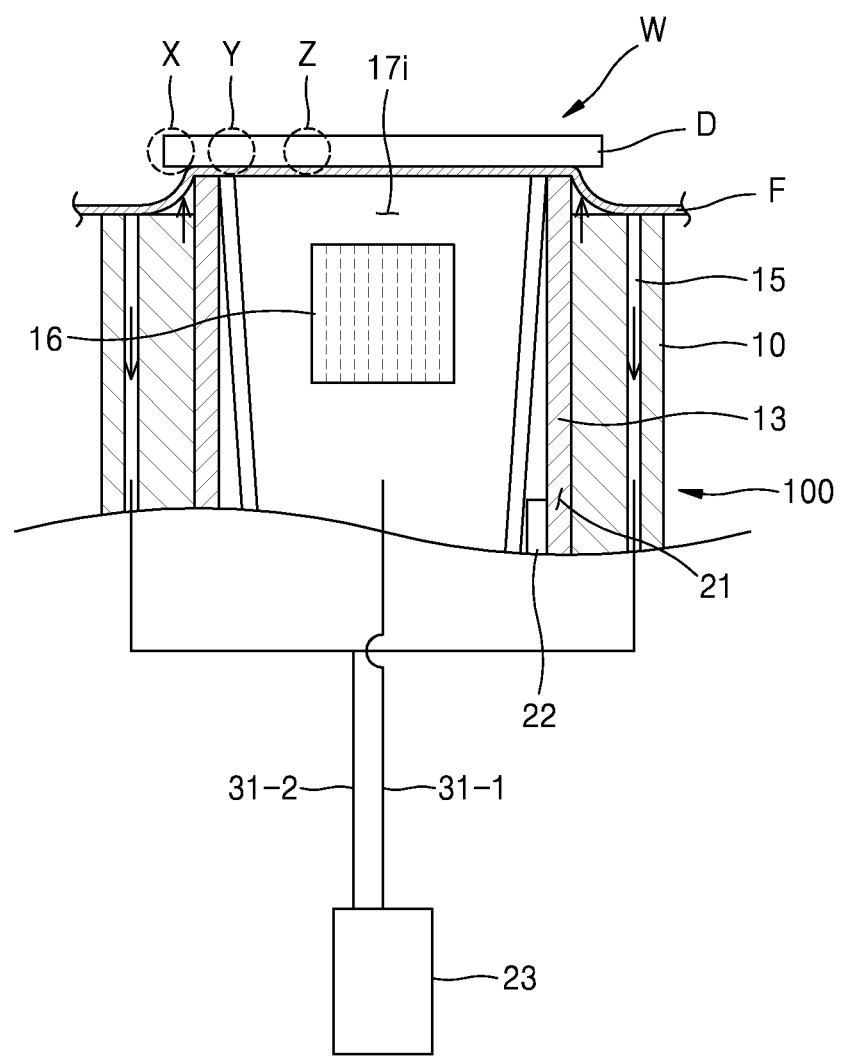
FIG. 8 is a diagram illustrating a process where an elevation device of a die ejector according to some example embodiments is raised to a separation position and thus a portion of a film is separated from a die.
Figure 9:
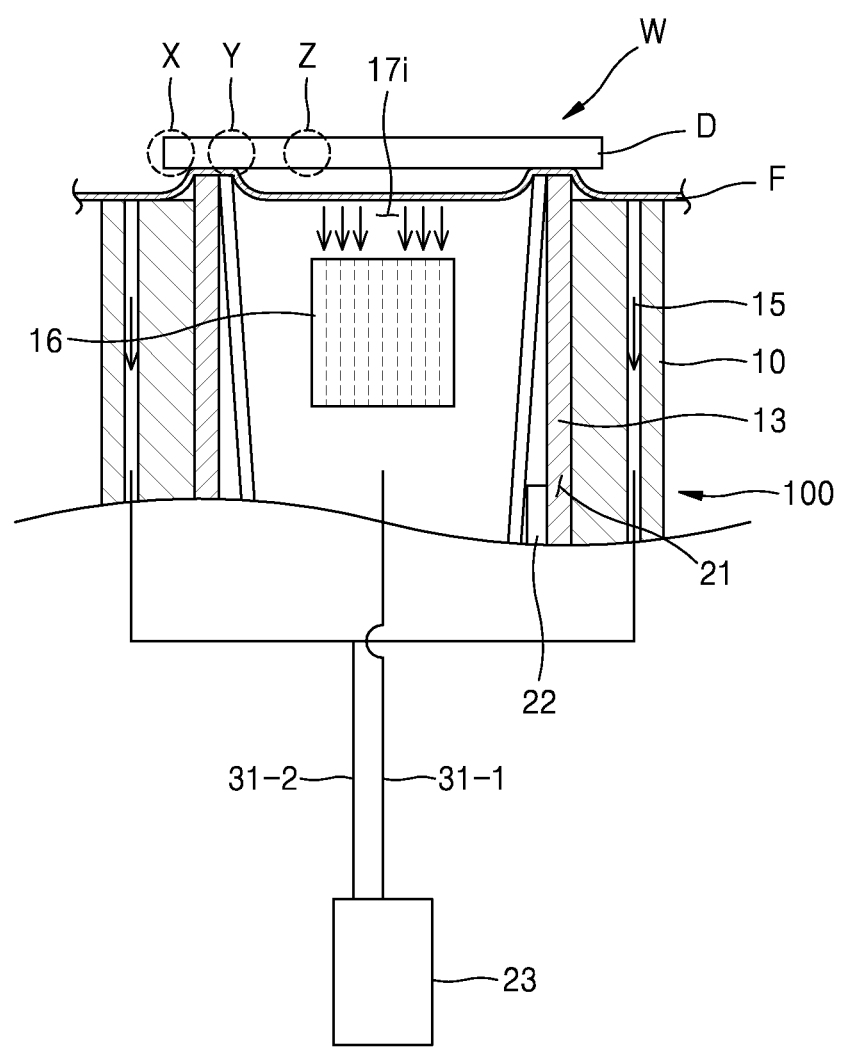
FIG. 9 is a diagram illustrating a process where suction pressure is applied to a hole of a die ejector according to some example embodiments and thus a portion of a film is separated from a die.
Figure 10:
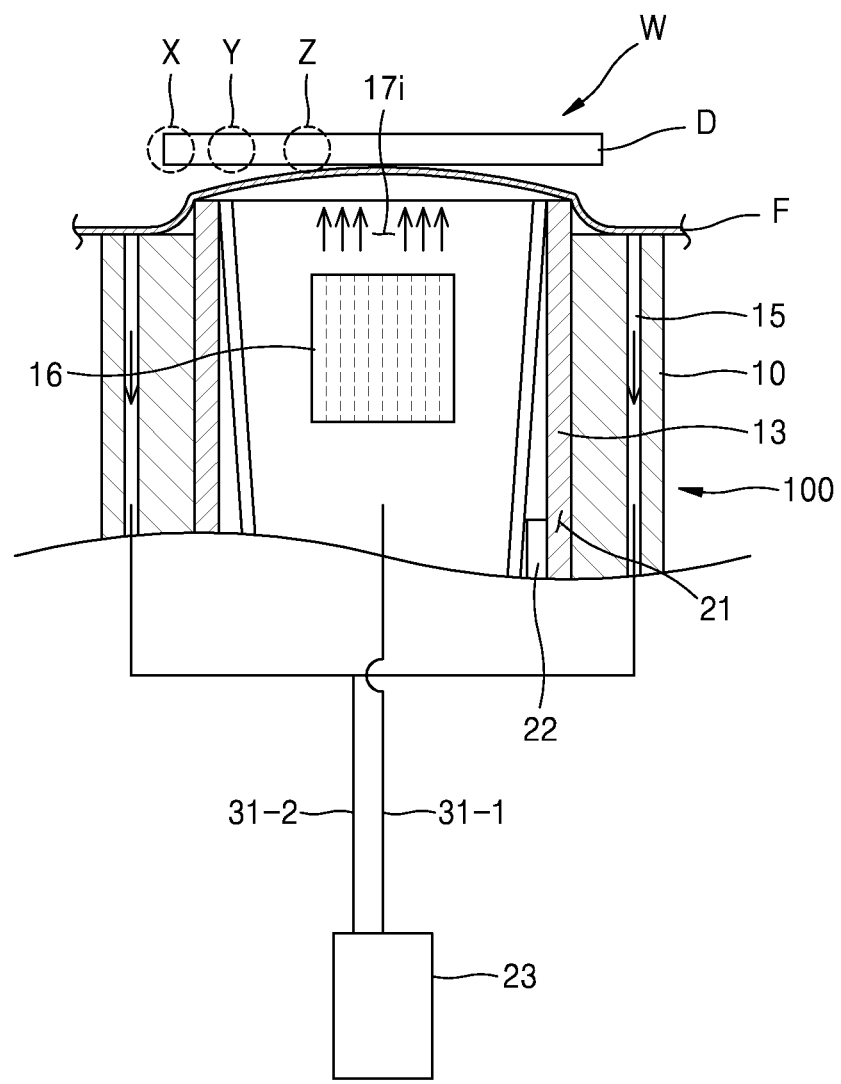
FIG. 10 is a diagram illustrating a process where injection pressure is applied to a hole of a die ejector according to some example embodiments and thus a portion of a film is separated from a die.

FIGS. 8 to 10 are diagrams illustrating a process of separating a die D from a film F.

FIG. 8 is a diagram illustrating a process where an elevation device 13 of a die ejector 100 according to some example embodiments is raised to a separation position and thus a portion of the film F is separated from the die D.

The die D which is to be separated from the film F may be disposed on the die ejector 100 according to some example embodiments. The hole 14 and the elevation device 13 of the die ejector 100 may be disposed under a center region of the die D. Therefore, four side surfaces of the die D may be disposed in the supporter 10. When a position of the die D is aligned, the pressure adjuster device 23 may operate the depressurization device 32 to generate suction pressure in upper portions of the fixing holes 15. When the suction pressure is generated in the fixing holes 15, the film F of the wafer W may be solidly fixed to the supporter 10.

A region, supported by the supporter 10, of the die D may be referred to as a first region X. A region, supported by the elevation device 13, of the die D may be referred to as a second region Y. A region, exposed at the hole 14, of the die D may be referred to as a third region Z.

When the film F of the wafer W is solidly fixed to the supporter 10 by the fixing holes 15, the controller 39 may operate the driver 22 to raise the elevation device 13 to the separation position. Even when the elevation device 13 is being raised, a force may be downward applied to the film F attached on a lower surface of a first region X of the die D by using the fixing holes 15. Therefore, the film F attached on the lower surface of the first region X may be separated from the die D. A force applied to the die D by the elevation device 13 may vary based on an elevation speed at which the elevation device 13 is raised. Accordingly, the controller 39 may control the elevation speed of the elevation device 13 in order for the die D not to be damaged by the force of the elevation device 13.

FIG. 9 is a diagram illustrating a process where suction pressure is applied to a hole 14 of a die ejector 100 according to some example embodiments and thus a portion of a film F is separated from a die D.

The film F attached on a lower surface of a third region Z of the die D may be separated from the die D by suction pressure applied to the hole 14. The pressure adjuster device 23 may depressurize an inner portion of the hole 14. In more detail, the controller 39 may control the depressurization valve 38a in order for the main line 31 of FIG. 3 to be coupled to the depressurization line 35 and may operate the depressurization device 32. An internal gas of the hole 14 may be exhausted to the outside by the depressurization device 32, and thus, suction pressure may be generated in the hole 14. When the suction pressure is generated in the hole 14, a force may be downward applied to the film F attached on the lower surface of the third region Z of the die D, and thus, the film F may be separated from the third region Z of the die D. In a process of separating the film F from the lower surface of the die D, a force based on the suction pressure or the film F may be applied to the third region Z of the die D. The force applied to the third region Z of the die D may increase in proportion to a level of the suction pressure generated in the hole 14. Accordingly, the controller 39 may control the depressurization device 32 in order for the die D not to be damaged by the suction pressure generated in the hole 14.

Moreover, the controller 39 may control the depressurization device 32 so as to apply different suction pressures, based on a thickness of the die D. This is because a level of suction pressure causing damage of the die D varies based on the thickness of the die D.

A process of generating the suction pressure in the hole 14 may start in a state where the elevation device 13 has been raised, but example embodiments are not limited thereto. In other embodiments, when the elevation device 13 starts to be raised, the suction pressure may be generated in the hole 14, and after the suction pressure is generated in the hole 14, the elevation device 13 may start to be raised.

FIG. 10 is a diagram illustrating a process where injection pressure is applied to a hole 14 of a die ejector 100 according to some example embodiments and thus a portion of a film F is separated from a die D.

After suction pressure is generated in the hole 14, the controller 39 may control the pressure adjuster device 23 so as to apply injection pressure to the hole 14. In more detail, the controller 39 may control the pressurization valve 38b in order for the main line 31 to be coupled to the pressurization line 36. In some example embodiments, the controller 39 may operate the pressurization device 33 to supply a gas to the hole 14, thereby providing injection pressure.

The film F may include a material which is high in ductility, and thus, the film F provided with the injection pressure may have a convex shape as in FIG. 10. In a process of forming the convex shape of the film F, the film F may be separated from the die D in all portions, other than a center, of the die D. In more detail, the film F disposed under a first region X and a second region Y of the die D may be separated from the die D.

The controller 39 may control the pressurization device 33 so that a level of the injection pressure generated in the hole 14 varies depending on the case. In other words, similarly to a case where the suction pressure is generated in the hole 14, the controller 39 may control the pressurization device 33 so that the level of the injection pressure generated in the hole 14 varies based on a thickness of the die D.

Referring to FIGS. 8 to 10, by using the die ejector 100 according to some example embodiments, the film F disposed on a lower surface of each of the first region X, the second region Y, and the third region Z of the die D may be stably separated from the die D. Referring to FIGS. 8-10 in view of FIG. 3, the controller 39, which may be implemented based on the processor 39b executing a program of instructions stored on the memory device 39a, may control the driver 22 and the pressure adjuster device 23 to separate the film F on the supporter 10 from the die D.

Figure 11:
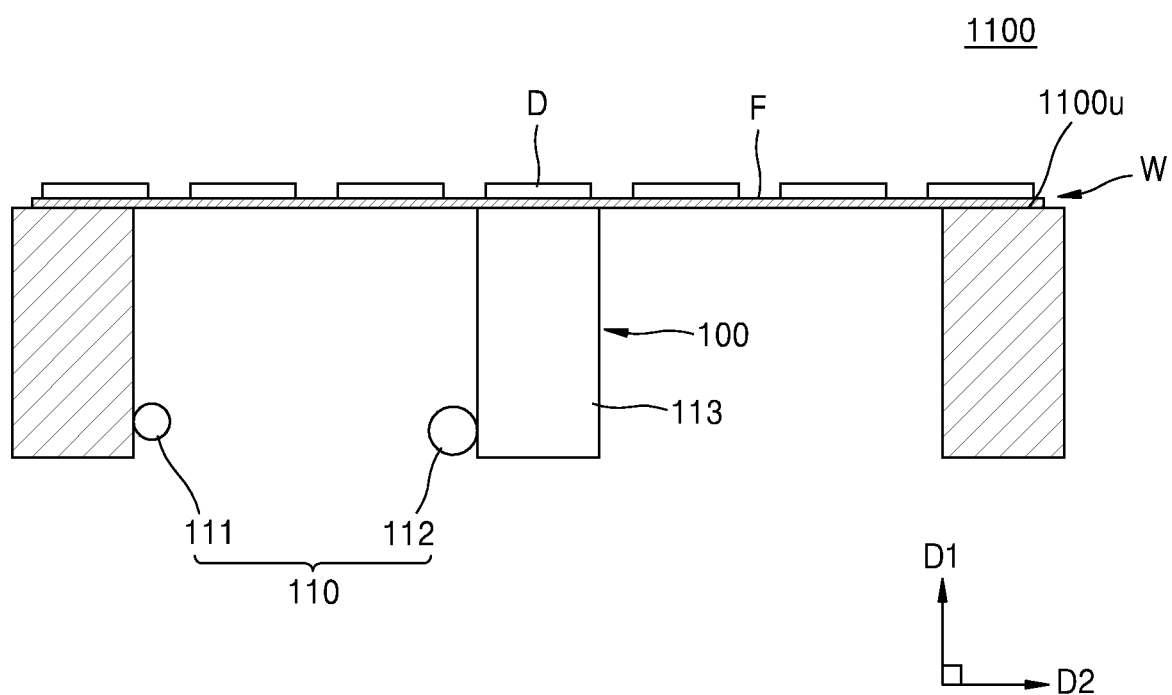
FIG. 11 is a side cross-sectional view of a wafer holder including a die ejector according to some example embodiments.

FIG. 11 is a side cross-sectional view of a wafer holder 1100 including a die ejector 100 according to some example embodiments. The die ejector 100 may be any of the example embodiments of die ejectors 100 described herein.

The wafer holder 1100 may support the wafer W in the vertical direction D1, the vertical direction D1 being perpendicular or substantially perpendicular to the upper surface 1100u of the wafer holder 1100, while the die D is being separated from the wafer W. The wafer W may be a wafer W on which a sawing process has been performed after a film F is attached on a lower surface thereof, and thus, a plurality of dies D are attached on an upper surface of the film F. Restated. The wafer W may include the plurality of dies D on the film F. In some example embodiments, a wafer ring (not shown) may be provided in an edge of the wafer W. The wafer holder 1100 may support the wafer W while pulling the wafer ring to an outer side. When the wafer ring is attracted to the outer side, the film F may expand, and thus, the dies D may be easily separated from the film F.

The die ejector 100 according to some example embodiments may be placed in the wafer holder 1100. The die ejector 100, as described above, may separate the die D from the film F. The separated die D may be picked up by a bonding head (129 of FIG. 12) and may be attached on a substrate placed on a working table.

The wafer holder 1100 may include a first transport member 111. The first transport member 111 may one-dimensionally move the wafer holder 1100 with respect to the die ejector 100. Therefore, when one die D is picked up by the bonding head after being separated from the film F by the die ejector 100, the wafer holder 1100 may move so that another die D is placed on the die ejector 100.

Moreover, the die ejector 100 may further include a cover part 113 and a second transport member 112. The cover part 113 may surround an external appearance of the die ejector 100. The second transport member 112 may be coupled to the cover part 113 and may one-dimensionally move the die ejector 100 with respect to the wafer holder 1100. Therefore, when one die D is picked up by the bonding head after being separated from the film F by the die ejector 100, the die ejector 100 may move so that another die D is placed on the die ejector 100. The first transport member 111 and the second transport member 112 may be provided, and the wafer holder 1100 and the die ejector 100 may simultaneously move. In some example embodiments, one of the first transport member 111 and the second transport member 112 may be omitted, and thus, only one of the die ejector 100 and the wafer holder 1100 may move.

Figure 12:
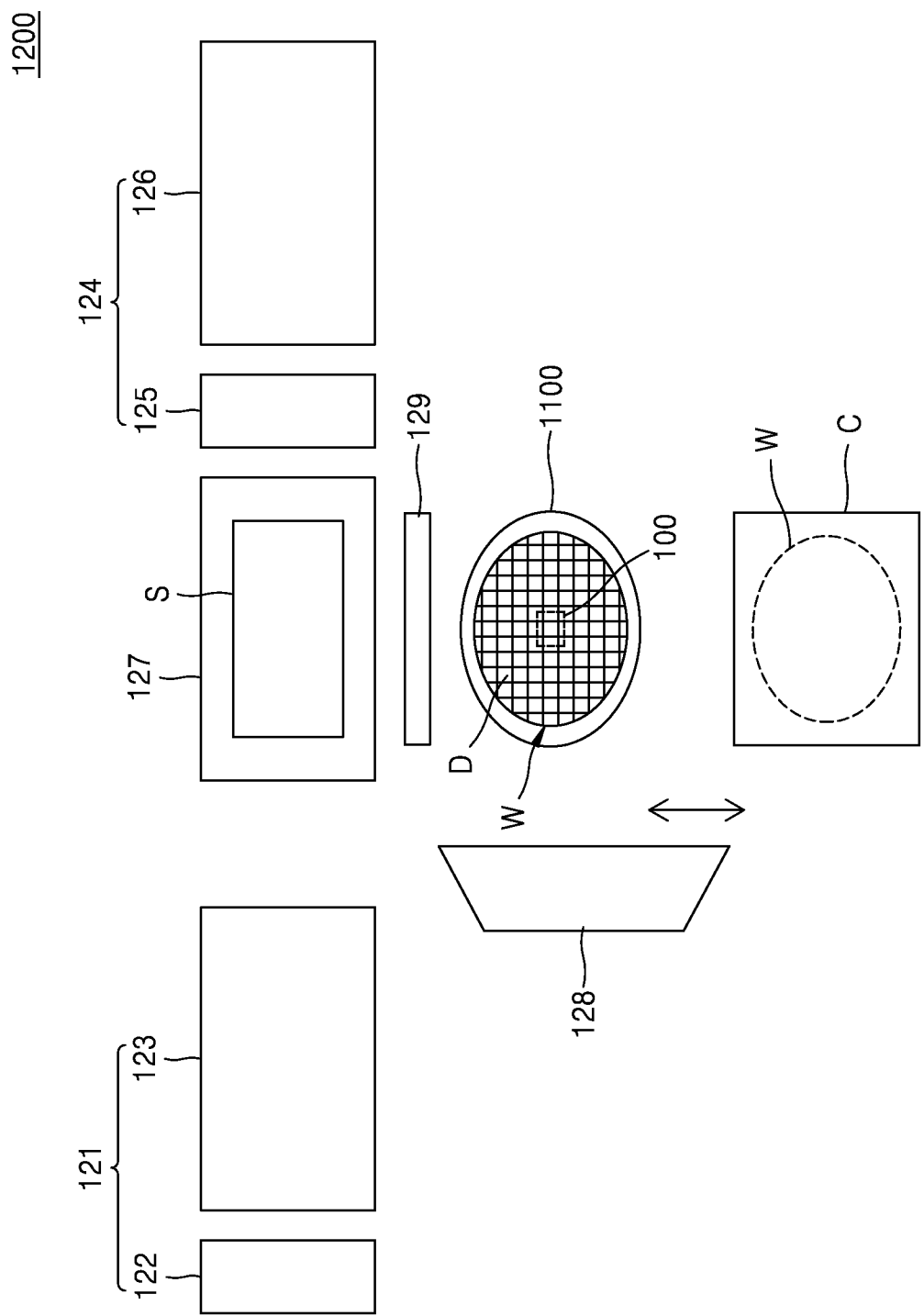
FIG. 12 is a plan view illustrating a die supplying apparatus according to some example embodiments.

FIG. 12 is a plan view illustrating a die supplying apparatus 1200 according to some example embodiments.

Referring to FIG. 12, the die supplying apparatus 1200 according to some example embodiments may include a loading device 121, a working table 127, an unloading device 124, a transport member 110, a transport robot 128, a bonding head 129, a die ejector 100, and a wafer holder 1100.

The loading device 121 may include a supply vessel 123 and a loader 122. The supply vessel 123 may accommodate a substrate S on which a die D is to be attached. The loader 122 may sequentially load at least one substrate S accommodated into the supply vessel 123 onto the working table 127.

The working table 127 may be disposed adjacent to the loading device 121. The substrate S loaded onto the loading device 121 may be placed on the working table 127, and then, may provide a space where the die D is attached on the substrate S.

The unloading device 124 may unload the at least one substrate S with the die D attached thereon from the working table 127. The unloading device 124 may be disposed adjacent to the working table 127. The unloading device 124 may include an accommodation vessel 126 and an unloader 125. The accommodation vessel 126 may accommodate the at least one substrate S with the die D attached thereon, and the unloader 125 may unload the at least one substrate S with the die D attached thereon from the working table 127 and may allow the at least one substrate S to be accommodated into the accommodation vessel 126.

The wafer holder 1100 may support the wafer W while the die D is being separated from the wafer W. The technical spirit of the wafer holder 1100 is substantially the same as description given above with reference to FIG. 11, and thus, its detailed description is omitted.

The transport member 110 may include the first transport member 111 and the second transport member 112 each described above with reference to FIG. 11. The transport member 110, as described above, may one-dimensionally and relatively move the wafer holder 1100 with respect to the die ejector 100.

The transport robot 128 may unload the wafer W from a cassette and may place the wafer W on the wafer holder 1100.

The bonding head 129 may pick up the die D separated from the film F, and then, may attach the die D on the substrate S placed on the working table 127. In some example embodiments, the bonding head 129 may pick up an upper surface of the die D in a vacuum manner, and then, may move the die D to the substrate S placed on the working table 127. The die D may be attached on the substrate S by an adhesive.

The die ejector 100, as described above with reference to FIG. 11, may be placed in the wafer holder 1100 and may separate the die D, placed on the wafer W, from the film F. The technical spirit of the die ejector 100 is substantially the same as description given above with reference to FIGS. 1 to 7, and thus, its detailed description is omitted.

The die ejector 100, as described above, may include the flow guide 16 provided in the air conduit guide 17. Accordingly, an air pressure deviation in the outlet of the air conduit guide 17 of the die ejector 100 may be reduced and/or minimized. In other words, pressure of air in the outlet of the air conduit guide 17 may be substantially uniform.

Therefore, the die supplying apparatus 1200 including the die ejector 100 may reduce bending of the die D in a process of separating the die D from the film F, thereby preventing the reduction in performance of the die D.

While the inventive concepts has been particularly shown and described with reference to embodiments thereof, it will be understood that various changes in form and details may be made therein without departing from the spirit and scope of the following claims.

What is claimed is:

1. A die ejector, comprising:
 a supporter, the supporter including an inner surface defining a hole in a center of the supporter, the supporter configured to support a film on which a die is attached in a vertical direction that is substantially perpendicular to an upper surface of the supporter;
 an elevation device in the hole of the supporter, the elevation device configured to move the film with the die attached thereon in the vertical direction and in relation to the supporter;
 a driver configured to move the elevation device in the vertical direction;
 an air conduit guide in an enclosure region at least partially defined by an inner surface of the elevation device, the air conduit guide having an inner surface defining an air flow conduit;
 a pressure adjuster device configured to induce air flow through the air flow conduit based on inducing a pressure gradient between the air flow conduit and the pressure adjuster device; and
 a flow guide in at least a portion of the air flow conduit, the flow guide configured to control a flow of air through the portion of the air flow conduit, based on adjusting a cross-sectional flow area of the air flow conduit and at least partially blocking the flow of air in the portion of the air flow conduit to cause the flow of air to bypass the flow guide to flow in a separate portion of the air flow conduit, such that a pressure difference between the portion of the air flow conduit and the separate portion of the air flow conduit at an outlet of the air conduit guide is reduced.

2. The die ejector of claim 1, wherein
the inner surface of the air conduit guide defines the cross-sectional flow area of the air flow conduit to be inversely proportional to distance from the outlet of the air conduit guide, and
the flow guide includes a plurality of through holes in a center region of the air flow conduit.

3. The die ejector of claim 2, wherein
the flow guide has a rectangular parallelepiped shape, and
the plurality of through holes extend through the flow guide in a circular pillar shape.

4. The die ejector of claim 3, wherein a diameter of each through hole of the plurality of through holes is about 300 μm to about 500 μm.

5. The die ejector of claim 4, wherein the flow guide includes a ceramic material.

6. A die ejector, comprising:
a supporter, the supporter including an inner surface defining a hole in a center of the supporter, the supporter configured to support a film on which a die is attached in a vertical direction that is substantially perpendicular to an upper surface of the supporter;
an elevation device in the hole of the supporter, the elevation device configured to move the film with the die attached thereon in the vertical direction and in relation to the supporter;
a driver configured to move the elevation device in the vertical direction;
an air conduit guide in an enclosure region at least partially defined by an inner surface of the elevation device, the air conduit guide having an inner surface defining an air flow conduit;
a pressure adjuster device configured to provide injection pressure or suction pressure to an inner portion of the air conduit guide;
a first flow guide extending through a central longitudinal axis of the air conduit guide in the air flow conduit; and
a plurality of second flow guides in the air conduit guide, the plurality of second flow guides each offset from the central longitudinal axis of the air conduit guide in a direction substantially perpendicular to the vertical direction, the plurality of second flow guides each offset from the first flow guide in the vertical direction,
wherein the first flow guide and the plurality of second flow guides are configured to control a flow of air in the air flow conduit.

7. The die ejector of claim 6, wherein
the inner surface of the air conduit guide defines the air flow conduit to have a cross-sectional flow area that is inversely proportional to distance from an outlet of the air conduit guide,
the first flow guide is an individual structure,
the plurality of second flow guides includes two second flow guides, and
the two second flow guides are symmetrically positioned in relation to the central longitudinal axis of the air conduit guide.

8. The die ejector of claim 7, wherein
the first flow guide is configured to control the flow of air in a center region of the air flow conduit, and
the two second flow guides are configured to control the flow of air passing through the first flow guide at positions spaced apart from the central longitudinal axis of the air conduit guide in the direction substantially perpendicular to the vertical direction.

9. The die ejector of claim 8, wherein the first flow guide and the two second flow guides include alloy tool steel.

10. The die ejector of claim 9, wherein the cross-sectional flow area of the air conduit guide at the outlet of the air conduit guide is less than a lower surface area of the die.

11. The die ejector of claim 10, further comprising:
a memory storing a program of instructions, and
a processor configured to execute the program of instructions to
control the driver and the pressure adjuster device to separate the film on the supporter from the die.

12. The die ejector of claim 11, wherein
the supporter further includes a plurality of fixing holes extending along an edge of the supporter, and
the pressure adjuster device is configured to apply suction pressure to the plurality of fixing holes to cause the film to be sucked onto the upper surface of the supporter.

13. A die supplying apparatus, comprising:
a wafer holder configured to support a wafer in a vertical direction that is substantially perpendicular to an upper surface of the wafer holder while a die is being separated from the wafer;
a transport robot configured to place the wafer on the wafer holder;
a die ejector configured to separate the die of the wafer from a film, the die ejector including
a supporter, the supporter including an inner surface defining a hole in a center of the supporter, the supporter configured to support the film on which the die is attached in the vertical direction, the vertical direction being substantially perpendicular to an upper surface of the supporter,
an elevation device in the hole of the supporter, the elevation device configured to move the film with the die attached thereon in the vertical direction and in relation to the supporter,
a driver configured to move the elevation device in the vertical direction,
an air conduit guide in an enclosure region at least partially defined by an inner surface of the elevation device, the air conduit guide having an inner surface defining an air flow conduit,
a pressure adjuster device configured to induce air flow through the air flow conduit based on inducing a pressure gradient between the air flow conduit and the pressure adjuster device, and
a flow guide in at least a portion of the air flow conduit, the flow guide configured to control a flow of air through the portion of the air flow conduit, based on adjusting a cross-sectional flow area of the air flow conduit and at least partially blocking the flow of air in the portion of the air flow conduit to cause the flow of air to bypass the flow guide to flow in a separate portion of the air flow conduit, such that a pressure difference between the portion of the air flow conduit and the separate portion of the air flow conduit at an outlet of the air conduit guide is reduced;
a transport member configured to relatively move the wafer holder with respect to the die ejector; and
a bonding head configured to pick up the separated die and attach the picked-up die on a substrate.

14. The die supplying apparatus of claim 13, wherein
the inner surface of the air conduit guide defines the cross-sectional flow area of the air flow conduit to be inversely proportional to distance from the outlet of the air conduit guide,
the flow guide is in a center region of the air flow conduit of the air conduit guide and has a rectangular parallelepiped shape, and
the flow guide includes a plurality of through holes extending through the flow guide.

15. The die supplying apparatus of claim 14, wherein
each through hole of the plurality of through holes has a circular pillar shape, and
a diameter of each through hole of the plurality of through holes is about 300 µm to about 500 µm.

16. The die supplying apparatus of claim 13, wherein the flow guide includes
a first flow guide extending through a central longitudinal axis of the air conduit guide in the air flow conduit; and
a plurality of second flow guides in the air conduit guide, the plurality of second flow guides each offset from the central longitudinal axis of the air conduit guide in a direction substantially perpendicular to the vertical direction, the plurality of second flow guides each offset from the first flow guide in the vertical direction.

17. The die supplying apparatus of claim 16, wherein
the air conduit guide has a trapezoid shape, such that the cross-sectional flow area of the air flow conduit is inversely proportional to distance from the outlet of the air conduit guide,
the first flow guide is an individual structure,
the plurality of second flow guides includes two second flow guides,
the two second flow guides are symmetrically positioned in relation to the central longitudinal axis of the air conduit guide,
the first flow guide is configured to control the flow of air in a center region of the air flow conduit, and
the two second flow guides are configured to control the flow of air passing through the first flow guide at positions spaced apart from the central longitudinal axis of the air conduit guide in the direction substantially perpendicular to the vertical direction.

18. The die supplying apparatus of claim 17, wherein
a separation distance between the two second flow guides in the direction substantially perpendicular to the vertical direction is greater than a width of the first flow guide in the direction substantially perpendicular to the vertical direction, and
a vertical distance between the first flow guide and each of the two second flow guides in the vertical direction is about 0.5 to 3 times the separation distance between the two second flow guides in the direction substantially perpendicular to the vertical direction.

19. The die supplying apparatus of claim 17, wherein the die ejector further includes
a memory storing a program of instructions, and
a processor configured to execute the program of instructions to control the driver and the pressure adjuster device to separating the film on the supporter from the die.

20. The die supplying apparatus of claim 19, wherein
the supporter further includes a plurality of fixing holes extending along an edge of the supporter, and
the pressure adjuster device is configured to apply suction pressure to the plurality of fixing holes to cause the film to be sucked onto the upper surface of the supporter.

* * * * *